(12) United States Patent
Matsuda et al.

(10) Patent No.: US 12,446,185 B2
(45) Date of Patent: Oct. 14, 2025

(54) COLD PLATE

(71) Applicant: Fujikura Ltd., Tokyo (JP)

(72) Inventors: Masahiro Matsuda, Tokyo (JP); Koichi Mashiko, Tokyo (JP); Yoji Kawahara, Tokyo (JP)

(73) Assignee: FUJIKURA LTD., Tokyo (JP)

( * ) Notice: Subject to any disclaimer, the term of this patent is extended or adjusted under 35 U.S.C. 154(b) by 124 days.

(21) Appl. No.: 18/546,146

(22) PCT Filed: Jan. 21, 2022

(86) PCT No.: PCT/JP2022/002209
§ 371 (c)(1),
(2) Date: Aug. 11, 2023

(87) PCT Pub. No.: WO2022/269965
PCT Pub. Date: Dec. 29, 2022

(65) Prior Publication Data
US 2024/0121912 A1   Apr. 11, 2024

(30) Foreign Application Priority Data

Jun. 22, 2021   (JP) ................. 2021-102878

(51) Int. Cl.
*H05K 7/20* (2006.01)
(52) U.S. Cl.
CPC ..... *H05K 7/20254* (2013.01); *H05K 7/20263* (2013.01)
(58) Field of Classification Search
CPC .. H05K 7/20254; H05K 7/20263; H05K 7/20; H01L 23/473; F28F 3/12

USPC ........................................... 165/80.3
See application file for complete search history.

(56) References Cited

U.S. PATENT DOCUMENTS

| | | | |
|---|---|---|---|
| 11,112,189 B2* | 9/2021 | Nakano | H01L 23/473 |
| 2018/0332734 A1* | 11/2018 | Bandorawalla | H01L 21/4882 |
| 2020/0025466 A1* | 1/2020 | Nakano | H01L 21/4882 |
| 2022/0128323 A1* | 4/2022 | Mashiko | F28F 3/048 |
| 2023/0389227 A1* | 11/2023 | Okuno | H05K 7/20254 |
| 2024/0200888 A1* | 6/2024 | Matsuda | H05K 7/20 |

FOREIGN PATENT DOCUMENTS

| | | |
|---|---|---|
| JP | 2017-22374 A | 1/2017 |
| JP | 2018-81997 A | 5/2018 |
| JP | 6712915 B2 | 6/2020 |

OTHER PUBLICATIONS

International Search Report issued in corresponding International Application No. PCT/JP2022/002209 mailed Mar. 29, 2022 (2 pages).

\* cited by examiner

*Primary Examiner* — Jon T. Schermerhorn, Jr.
(74) *Attorney, Agent, or Firm* — Osha Bergman Watanabe & Burton LLP (57) ABSTRACT

A cold plate includes: a metal base plate having a first surface, a second surface on a side opposite the first surface, and fins disposed in parallel on the first surface; and a topped cylindrical resin cover covering the fins. The first surface has a recessed portion recessed toward the second surface. The topped cylindrical resin cover is heat-fused to the metal base plate on an inner surface of the recessed portion.

8 Claims, 6 Drawing Sheets

COLD PLATE

CROSS-REFERENCE TO RELATED APPLICATIONS

This application claims priority to Japanese Patent Application No. 2021-102878, filed on Jun. 22, 2021, the entire content of which is incorporated herein by reference.

TECHNICAL FIELD

The present invention relates to a cold plate.

BACKGROUND

Patent Document 1 discloses a cold plate that includes a metal base plate having a plurality of fins arranged in parallel and a metal cover covering the plurality of fins.

PATENT LITERATURE

Patent Document 1

Japanese Patent No. 6712915

Due to an increase in heat generation density according to high integration of electronic components in recent years, a demand for cold plates is expected to grow, and there is a demand for cold plates at a lower price. Therefore, replacing a conventional metal cover with a resin cover that is lower in cost than a metal cover has been studied. In such a cold plate having a resin cover, a configuration in which the resin cover is directly heat-fused to the base plate without using an adhesive or the like is conceivable.

However, as a result of verification by the inventors of the present application, it has been found that, when a resin cover is heat-fused to a base plate, a molten resin may flow to the inside and the outside of the resin cover and form burrs. There have been cases in which burrs formed inside the resin cover narrow a flow path of a refrigerant flowing through the cold plate, or peel off from the resin cover to clog the flow path. In these cases, the burrs formed inside the resin cover may cause deterioration in cooling performance of the cold plate. There have been cases in which the burrs formed outside the resin cover peel off from the resin cover and fall off from the cold plate. In this case, the burrs formed outside the resin cover may adversely affect electronic equipment to which the cold plate is attached.

SUMMARY

One or more embodiments of the present invention provide a cold plate capable of suppressing occurrence of burrs when a resin cover is heat-fused to a base plate.

A cold plate according to one or more embodiments of the present invention includes a metal base plate having a first surface, a second surface positioned on a side opposite to the first surface, and a plurality of fins arranged in parallel on the first surface, and a topped cylindrical resin cover covering the plurality of fins, in which a recessed portion recessed toward the second surface is formed on the first surface, and the resin cover is heat-fused to the base plate on an inner surface of the recessed portion.

According to the above-described embodiments of the present invention, the heat-melted resin tends to accumulate in the recessed portion formed in the cold plate. Thereby, protrusion of the resin from the recessed portion, that is, formation of burrs, is suppressed.

Here, a first roughened portion having a plurality of micropores may be formed on the inner surface of the recessed portion, and the resin cover may be heat-fused to the base plate at the first roughened portion.

Also, a resin reservoir communicating with a space surrounded by the recessed portion may be formed in the base plate.

Also, the resin reservoir may be recessed from a bottom surface of the recessed portion toward the second surface.

Also, the resin reservoir may protrude outward from the recessed portion when viewed from a facing direction in which the base plate and the resin cover face each other, and the resin reservoir may open to the first surface.

Also, the resin reservoir may overlap the first surface when viewed from a facing direction in which the base plate and the resin cover face each other.

Also, the recessed portion may have a tapered structure in which an inner diameter of the recessed portion gradually increases in a direction from the bottom surface of the recessed portion toward the first surface, and a second roughened portion may be formed on a side surface of the recessed portion.

Also, a flange portion extending toward the outside of the resin cover and having a surface which is heat-fused to the base plate may be formed at an opening end portion of the resin cover, and a dimension of the recessed portion in a facing direction in which the base plate and the resin cover face each other may be larger than a dimension of the flange portion in the facing direction.

According to the above-described embodiments, it is possible to provide a cold plate capable of suppressing occurrence of burrs when a resin cover is heat-fused to a base plate.

DETAILED DESCRIPTION

First Embodiments

A cold plate according to first embodiments will be described below with reference to the drawings.

Figure 1:
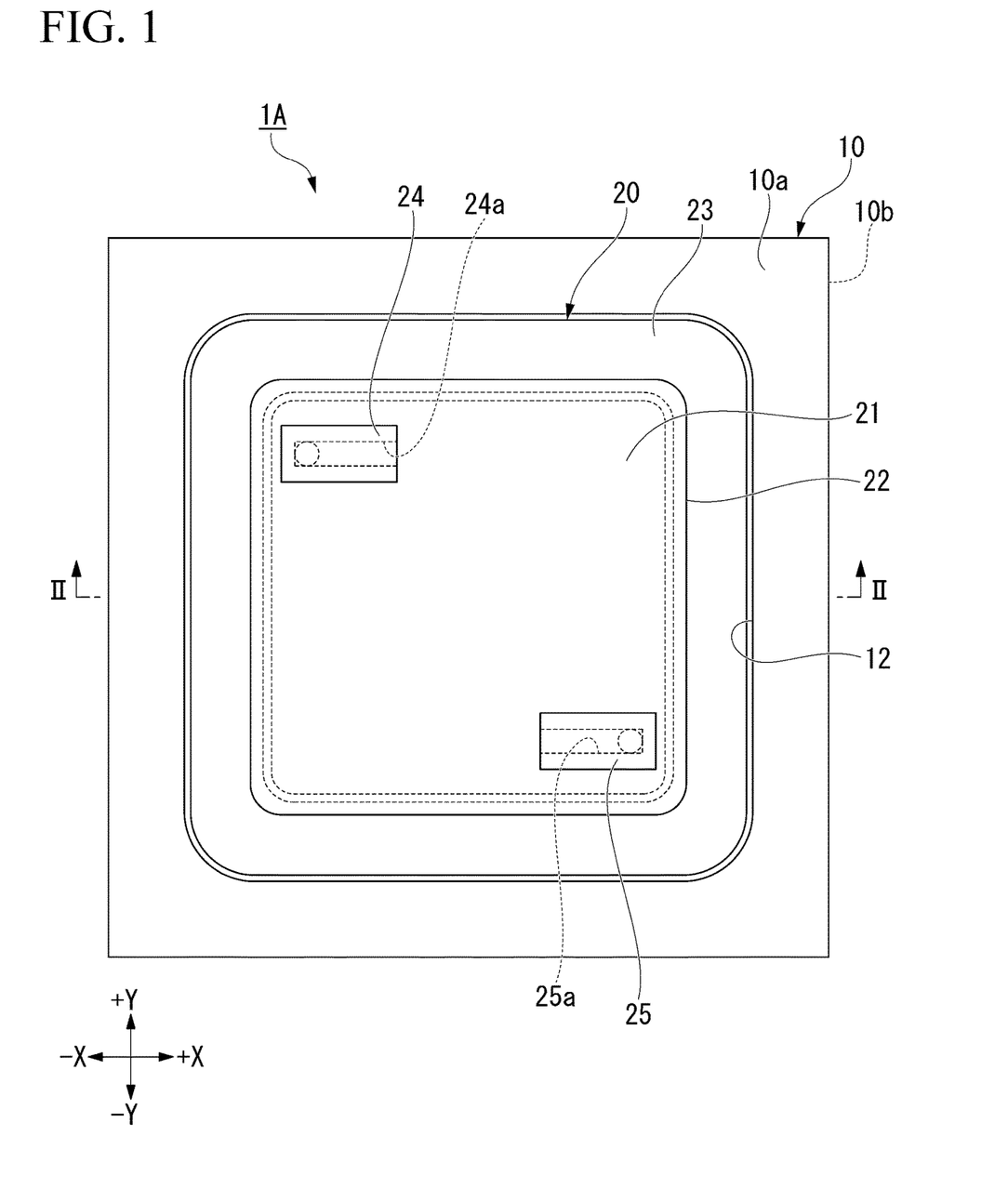
FIG. 1 is a plan view illustrating a cold plate according to first embodiments.
Figure 2:
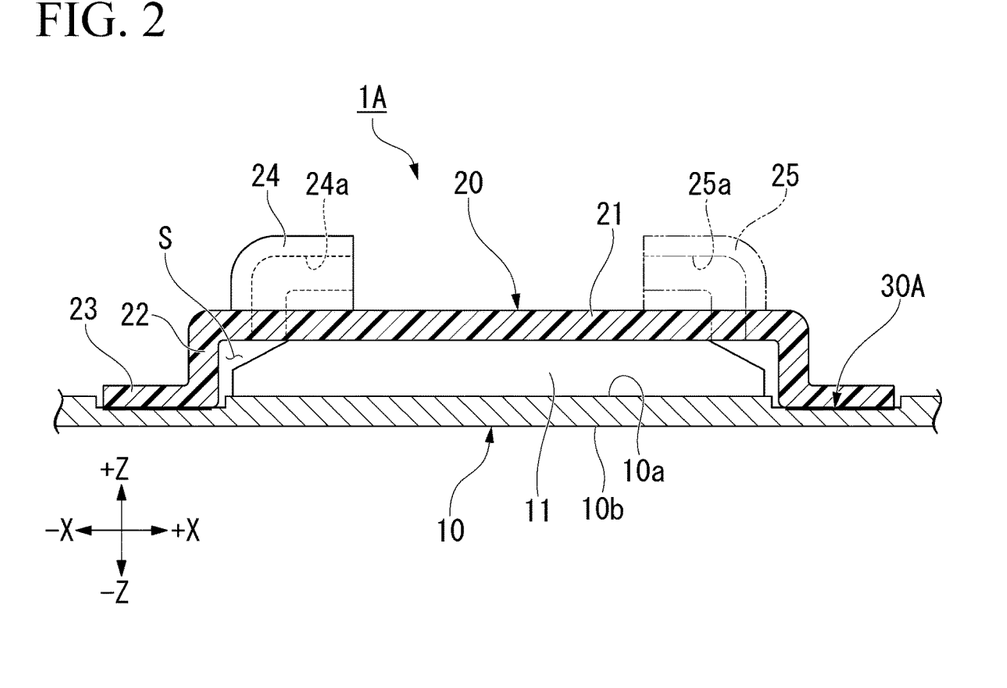
FIG. 2 is a cross-sectional view taken along the cross section II-II illustrated in FIG. 1.

As illustrated in FIGS. 1 and 2, a cold plate 1A includes a metal base plate 10 and a resin cover 20. The base plate 10 includes a first surface 10a and a second surface 10b positioned on a side opposite to the first surface 10a. The base plate 10 includes a plurality of fins 11 that are arranged in parallel on the first surface 10a. The plurality of fins 11 are each formed in a plate shape. A shape of the resin cover 20 is a topped cylindrical shape. The resin cover 20 covers the plurality of fins 11. Since the resin cover 20 covers the base plate 10, the cold plate 1A has a hollow container shape as a whole.

Definition of Directions

Here, in one or more embodiments, a direction in which the base plate 10 and the resin cover 20 face each other is referred to as a facing direction Z. The facing direction Z is also a direction in which the first surface 10a and the second surface 10b of the base plate 10 are aligned. Alternatively, the facing direction Z is also a direction perpendicular to the base plate 10. In the present specification, a view from the facing direction Z may be referred to as a plan view. The facing direction Z is also referred to as a vertical direction Z. However, the vertical direction Z may or may not be parallel to a direction of gravity. A direction from the base plate 10 toward the resin cover 20 in the facing direction Z is referred to as a +Z direction or an upward direction. The +Z direction is also a direction from the second surface 10b of the base plate 10 toward the first surface 10a thereof. A direction opposite to the +Z direction is referred to as a −Z direction or a downward direction. Of directions in which the plurality of fins 11 extend, a direction orthogonal to the facing direction Z is referred to as a first direction X. One direction in the first direction X is referred to as a +X direction or a rightward direction. A direction opposite to the +X direction is referred to as a −X direction or a leftward direction. A direction orthogonal to both the facing direction Z and the first direction X is referred to as a second direction Y. One direction in the second direction Y is referred to as a +Y direction or a back side. A direction opposite to the +Y direction is referred to as a −Y direction or a front side.

The base plate 10 may be formed of a metal having satisfactory thermal conductivity. As a material of the base plate 10, for example, it is possible to use copper, a copper alloy, aluminum, an aluminum alloy, or the like. As illustrated in FIG. 2, the first surface 10a of the base plate 10 according to one or more embodiments faces upward, and the second surface 10b thereof faces downward. The first surface 10a is also referred to as an upper surface 10a. The second surface 10b is also referred to as a heat source surface 10b.

In one or more embodiments, the plurality of fins 11 protrude upward from the first surface 10a of the base plate 10. The plurality of fins 11 are arranged in parallel in the second direction Y at substantially regular intervals. "Substantially regular" also includes a case in which it is possible to regard intervals in the second direction Y as regular if manufacturing errors are removed. Note that, the intervals at which the plurality of fins 11 are arranged in parallel may not be substantially regular in the second direction Y. In one or more embodiments, the second surface 10b is a flat surface. A heat source (not illustrated) (CPU, other heat generating parts, or the like) is in contact with the second surface (heat source surface) 10b. Alternatively, a heat transfer member that transfers heat from a heat source (not illustrated) is in contact with the second surface 10b. Note that, a shape of the second surface 10b is not limited to a flat surface. It is possible to appropriately change a shape of the second surface 10b as long as a heat source or a heat transfer member is capable of being in contact with the second surface 10b.

Figure 3:
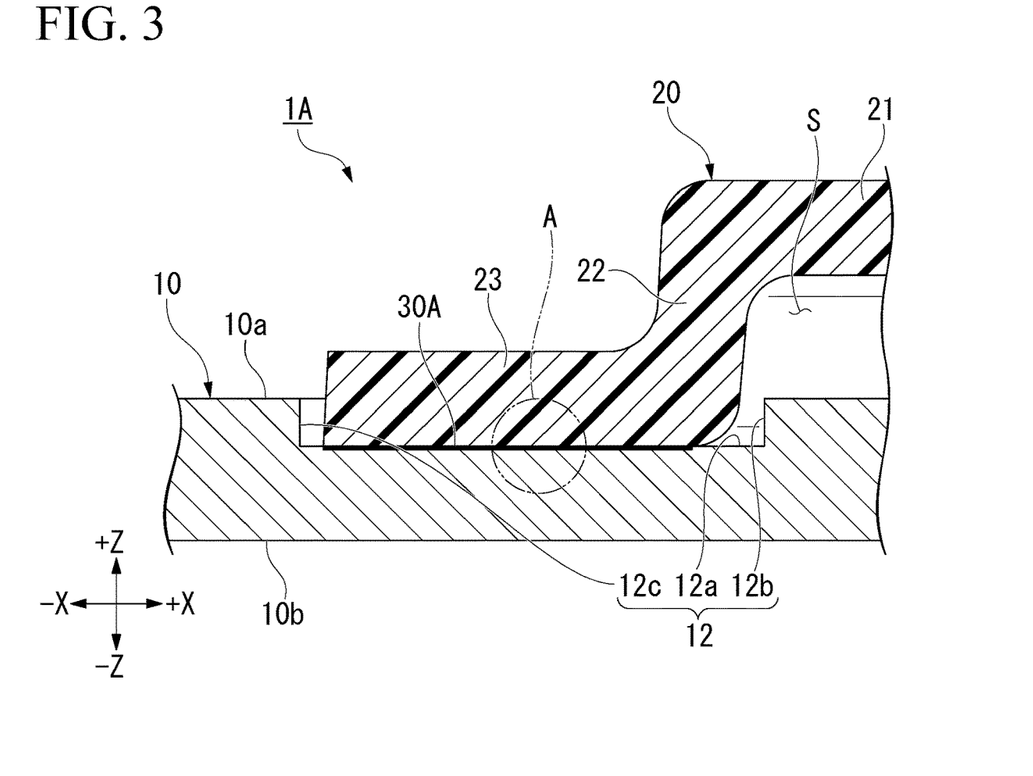
FIG. 3 is an enlarged view illustrating a part of FIG. 2.

A recessed portion 12 recessed toward the second surface 10b (downward) is formed on the first surface 10a of the base plate 10. The recessed portion 12 is formed in a substantially rectangular ring shape when viewed from the facing direction Z, and surrounds the plurality of fins 11 (see also FIG. 1). As illustrated in FIG. 3, an inner surface of the recessed portion 12 includes a bottom surface 12a, an inner side surface (side surface) 12b, and an outer side surface (side surface) 12c. The inner side surface 12b is a surface positioned on an inner circumferential side of the ring-shaped recessed portion 12. In other words, the inner side surface 12b corresponds to an inner circumferential surface of the recessed portion 12 formed in a ring shape. The outer side surface 12c is a surface positioned on an outer circumferential side of the ring-shaped recessed portion 12. In other words, the outer side surface 12c corresponds to an outer circumferential surface of the recessed portion 12 formed in a ring shape.

As a material of the resin cover 20, for example, it is possible to use polyphenylene sulfide (PPS), polyamide, polypropylene, polyethylene terephthalate, polyether ether ketone (PEEK), polyacetal (POM), and the like.

The resin cover 20 includes a top wall portion 21, a circumferential wall portion 22, and a flange portion 23. As illustrated in FIG. 1, the top wall portion 21 is formed in a substantially rectangular shape in the plan view. Note that, a shape of the top wall portion 21 is not limited to a substantially rectangular shape, and may be, for example, a substantially circular shape, a substantially elliptical shape, or a substantially polygonal shape in the plan view. "A substantially rectangular shape," "a substantially circular shape," "a substantially elliptical shape," or "a substantially polygonal shape" also includes a case in which it is regarded as a rectangular shape, a circular shape, an elliptical shape, or a polygonal shape in the plan view if chamfering and manufacturing errors are removed. The circumferential wall portion 22 extends downward from an outer circumferential edge of the top wall portion 21 so as to have a cylindrical shape. The flange portion 23 extends from a lower end (opening end portion) of the circumferential wall portion 22 toward the outside of the resin cover 20 so as to have a ring shape. As illustrated in FIG. 3, a lower surface of the flange portion 23 is in contact with a first roughened portion 30A (to be described later). The lower surface of the flange portion 23 is also a surface that is heat-fused to the base plate 10.

In one or more embodiments, an inlet connection part 24 and an outlet connection part 25 are formed in the resin cover 20. The inlet connection part 24 and the outlet connection part 25 each protrude upward from the top wall portion 21. A supply hole 24a penetrating the top wall portion 21 and the inlet connection part 24, and a drain hole 25a penetrating the top wall portion 21 and the outlet connection part 25 are formed in the resin cover 20. The supply hole 24a and the drain hole 25a each communicate with an internal space S of the cold plate 1A.

The inlet connection part 24 is a portion to which an inlet pipe (not illustrated) for supplying a refrigerant is connected. The refrigerant flows into the internal space S of the cold plate 1A through the inlet connection part 24 and the supply hole 24a. The outlet connection part 25 is a portion to which an outlet pipe (not illustrated) for discharging the refrigerant is connected. The refrigerant that has passed through the internal space S is discharged to the outside of the cold plate 1A through the drain hole 25a and the outlet connection part 25. As the refrigerant, for example, it is possible to use water, alcohol, other well-known compounds, or the like as appropriate.

In one or more embodiments, the supply hole 24a extends from a lower surface of the top wall portion 21 and opens to a right side surface of the inlet connection part 24. The drain hole 25a extends from a lower surface of the top wall portion 21 and opens to a left side surface of the outlet connection part 25. Note that, it is possible to appropriately change configurations of the supply hole 24a and the drain hole 25a as long as the supply hole 24a and the drain hole 25a each communicate with the internal space S of the cold plate 1A. For example, the cold plate 1A may not include the inlet connection part 24 and the outlet connection part 25. In this case, the supply hole 24a and the drain hole 25a may each pass through only the top wall portion 21. The supply hole 24a and the drain hole 25a may each penetrate through the circumferential wall portion 22.

Figure 4:
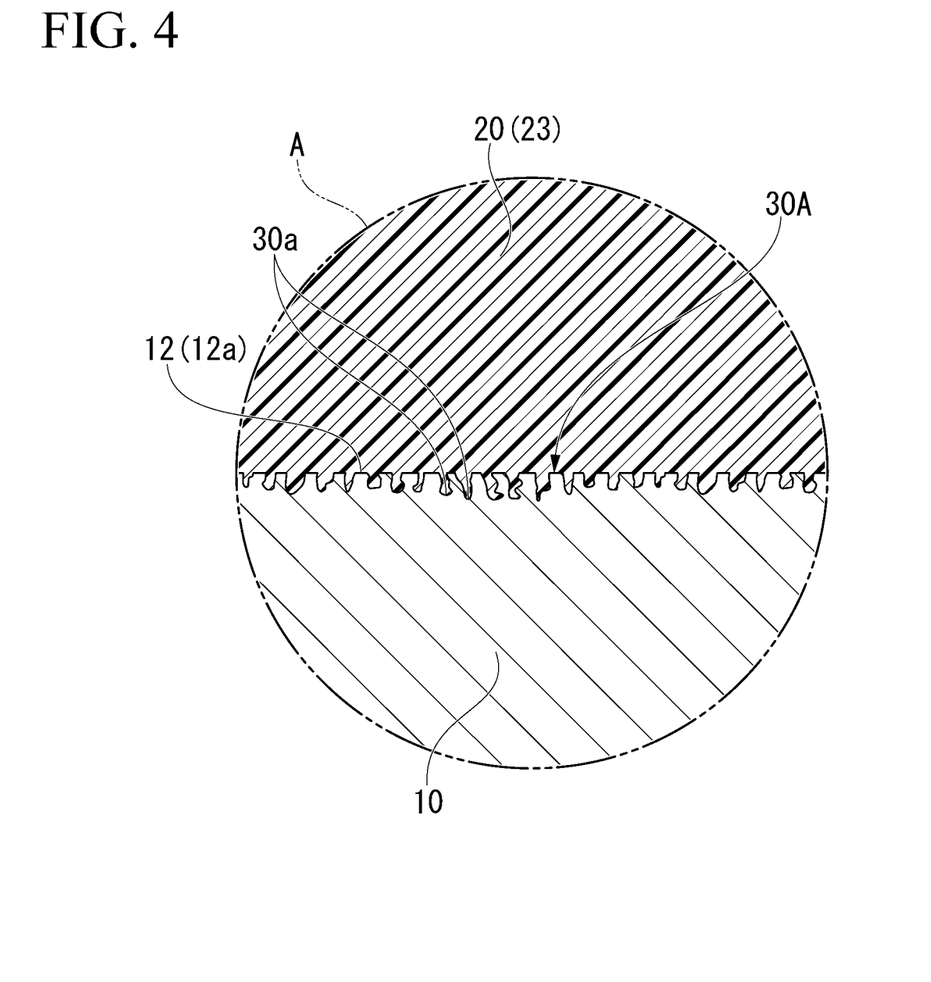
FIG. 4 is an enlarged view of a region A illustrated in FIG. 3.

As illustrated in FIGS. 2 and 3, the resin cover 20 (the flange portion 23) is heat-fused to the base plate 10 on the inner surface (the bottom surface 12a in one or more embodiments) of the recessed portion 12. Hereinafter, a principle by which the resin cover 20 is fused to the base plate 10 in one or more embodiments will be described. As illustrated in FIG. 4, the first roughened portion 30A is formed on the bottom surface 12a that is to be in contact with the flange portion 23 by an appropriate surface treatment to be described later. The first roughened portion 30A has a plurality of micropores 30a.

During the heat fusion, the recessed portion 12 is heated, and the flange portion 23 is pressed against the roughened bottom surface 12a. At this time, a part of the flange portion 23 is softened or melted, enters the micropores 30a, and then becomes solidified. As a result, the resin that has entered the micropores 30a and solidified serves as an anchor, and the resin cover 20 and the base plate 10 are firmly bonded. Note that, in order to prevent the molten resin from dripping out of the recessed portion 12 due to the influence of gravity, the operation of heat fusion described above may be performed with the bottom surface 12a (the first roughened portion 30A) facing upward in the direction of gravity.

As a surface treatment performed on the bottom surface 12a to form the first roughened portion 30A, for example, it is possible to use a chemical conversion treatment such as etching, or laser irradiation. When a chemical conversion treatment is used as the surface treatment for the bottom surface 12a, a portion of the base plate 10 that is not to be roughened may be appropriately masked. The surface treatment may be performed not only on the bottom surface 12a but also on the inner side surface 12b and the outer side surface 12c by performing a chemical conversion treatment such as etching on the entire recessed portion 12.

When laser irradiation is used as the surface treatment for the bottom surface 12a, the bottom surface 12a is oxidized by an action of laser light, and OH groups become abundant on a surface of the first roughened portion 30A. In this case, resin molecules forming the resin cover 20 form hydrogen bonds with the OH groups positioned on the surface of the first roughened portion 30A, and the resin cover 20 and the base plate 10 are more firmly bonded.

Next, an operation of the cold plate 1A configured as above will be described.

The cold plate 1A is a heat dissipation module that receives heat from a heat source or a heat transfer member that is in contact with the second surface (heat source surface) 10b of the base plate 10 and releases the received heat to the outside.

A refrigerant is supplied to the internal space S of the cold plate 1A through the supply hole 24a (see FIG. 2). Since the plurality of fins 11 extend in the first direction X in the internal space S of the cold plate 1A, the supplied refrigerant is guided in the first direction X and mainly flows toward the right. At this time, the refrigerant absorbs heat from the heat source via the base plate 10 (particularly the fins 11). The refrigerant that has absorbed heat is discharged to the outside of the cold plate 1A through the drain hole 25a. Through the process described above, the cold plate 1A is capable of receiving heat from the heat source and releasing the received heat to the outside.

Here, the cold plate 1A according to one or more embodiments includes the resin cover 20 that is heat-fused to the base plate 10. As a result of verification by the inventors of the present application, it has been found that when the resin cover 20 is heat-fused, there is a likelihood that the molten resin will flow to the inside and the outside of the resin cover 20 and form burrs. The burrs formed inside the resin cover 20 may narrow a flow path of the refrigerant flowing in the cold plate, or may peel off from the resin cover 20 and clog the flow path. In these cases, there is a likelihood that the burrs formed inside the resin cover 20 will cause deterioration in cooling performance of the cold plate. There have been cases in which the burrs formed outside the resin cover 20 peel off from the resin cover 20 and fall off from the cold plate. In this case, the burrs formed outside the resin cover 20 may adversely affect equipment to which the cold plate is attached.

In contrast, in the cold plate 1A according to one or more embodiments, the resin cover 20 and the base plate 10 are heat-fused at the bottom surface 12a of the recessed portion 12 formed in the base plate 10. Thereby, if the resin melts from the resin cover 20 during the heat fusion, the melted resin tends to accumulate inside the recessed portion 12. Thereby, the molten resin overflowing to the outside of the recessed portion 12 is suppressed. Therefore, the resin melted from the resin cover 20 forming burrs on the inside and the outside of the resin cover 20 is suppressed. Note that, in the present specification, the term "burrs" refers to a solidified product in which the molten resin overflows to the outside of the recessed portion 12 and is solidified.

In a case in which laser irradiation is used as the surface treatment for the bottom surface 12a, it is possible to oxidize the inner side surface 12b and the outer side surface 12c by an action of laser light reflected (diffusely reflected) by the bottom surface 12a. Also, it is possible to oxidize the inner side surface 12b and the outer side surface 12c by heat diffusion (heat conduction) from the bottom surface 12a heated by laser irradiation. By the inner side surface 12b and the outer side surface 12c being oxidized, the OH groups also become abundant on the inner side surface 12b and the outer side surface 12c, and molecules of the melted resin are easily adsorbed to the inner side surface 12b and the outer side surface 12c. In other words, it is possible to improve wettability of the inner side surface 12b and the outer side surface 12c by an action of the laser light diffusely reflected by the bottom surface 12a and heat diffusion from the bottom surface 12a. Thereby, the resin melted out of the resin cover 20 becomes difficult to eject out of the recessed portion 12 even if, for example, the cold plate 1A unexpectedly vibrates due to an external force or the like while the resin cover 20 is heat-fused. Therefore, formation of burrs is suppressed.

As described above, the cold plate 1A of one or more embodiments includes the metal base plate 10 having the first surface 10a, the second surface 10b positioned on a side opposite to the first surface 10a, and the plurality of fins 11 arranged in parallel on the first surface 10a, and the topped cylindrical resin cover 20 covering the plurality of fins 11, in which the recessed portion 12 recessed toward the second surface 10b is formed on the first surface 10a, and the resin cover 20 is heat-fused to the base plate 10 on an inner surface of the recessed portion 12.

With this configuration, the resin heat-melted from the resin cover 20 accumulates in the recessed portion 12 formed in the base plate 10. Thereby, protrusion of the resin from the recessed portion 12, that is, formation of burrs, is suppressed.

Also, the first roughened portion 30A having the plurality of micropores 30a is formed on the inner surface of the recessed portion 12, and the resin cover 20 is heat-fused to the base plate 10 at the first roughened portion 30A. With this configuration, a portion of the softened or melted resin cover 20 enters the micropores 30a and solidifies to serve the role of an anchor. Therefore, a bonding strength between the resin cover 20 and the base plate 10 is improved.

Second Embodiments

Next, second embodiments of the present invention will be described, but a basic configuration is the same as that of the first embodiments. Therefore, components which are the same are denoted by the same reference signs, description thereof will be omitted, and only different points will be described.

Figure 5:
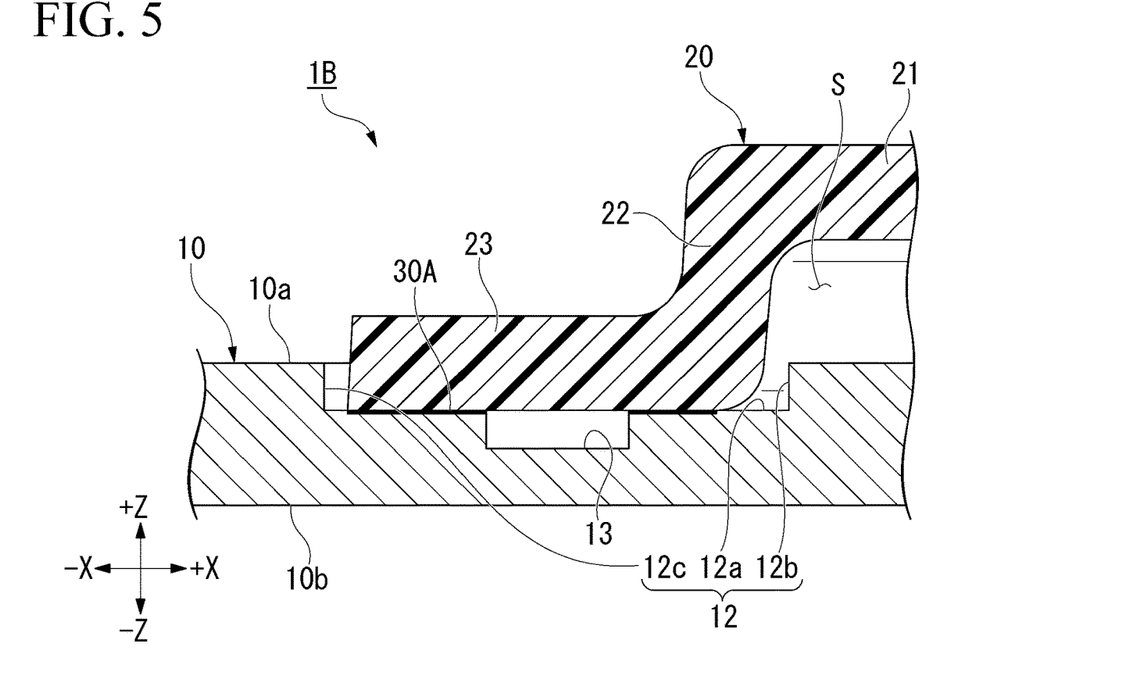
FIG. 5 is an enlarged view illustrating a part of a cold plate according to second embodiments.

In a cold plate 1B illustrated in FIG. 5, a resin reservoir 13 is formed in a base plate 10. The resin reservoir 13 communicates with a space surrounded by a recessed portion 12. In other words, the resin reservoir 13 is a recess (groove) that opens to the recessed portion 12. Particularly, the resin reservoir 13 according to one or more embodiments is recessed from a bottom surface 12a of the recessed portion 12 toward a second surface 10b (downward).

The resin reservoir 13 may be formed by, for example, subjecting the recessed portion 12 to etching processing, cutting processing, laser processing, or the like. The resin reservoir 13 may extend continuously along the recessed portion 12 that is formed in a ring shape when viewed from the facing direction Z. Alternatively, the resin reservoir 13 may be intermittently formed along the recessed portion 12. The resin reservoir 13 may be formed on an inner side surface 12b or an outer side surface 12c. Note that, a shape of the resin reservoir 13 is not limited to the example illustrated in FIG. 5. It is possible to change a shape of the resin reservoir 13 as appropriate as long as the resin reservoir 13 communicates with a space surrounded by the recessed portion 12.

As described above, in the cold plate 1B according to one or more embodiments, the resin reservoir 13 communicating with a space surrounded by the recessed portion 12 is formed in the base plate 10. With this configuration, the resin melted from the resin cover 20 flows into the resin reservoir 13. Therefore, the resin ejecting out of the recessed portion 12 and forming burrs is more reliably suppressed.

Also, the resin reservoir 13 is recessed from the bottom surface 12a of the recessed portion 12 toward the second surface 10b. This configuration is particularly effective when the resin cover 20 and the base plate 10 are heat-fused with the bottom surface 12a facing upward in the direction of gravity. This is because the resin melted from the resin cover 20 tends to flow into the resin reservoir 13 due to the influence of gravity. Thereby, the molten resin ejecting out of the recessed portion 12 and forming burrs is more reliably suppressed.

Third Embodiments

Next, third embodiments of the present invention will be described, but a basic configuration is the same as that of the second embodiments. Therefore, components which are the same are denoted by the same reference signs, description thereof will be omitted, and only different points will be described.

Figure 6:
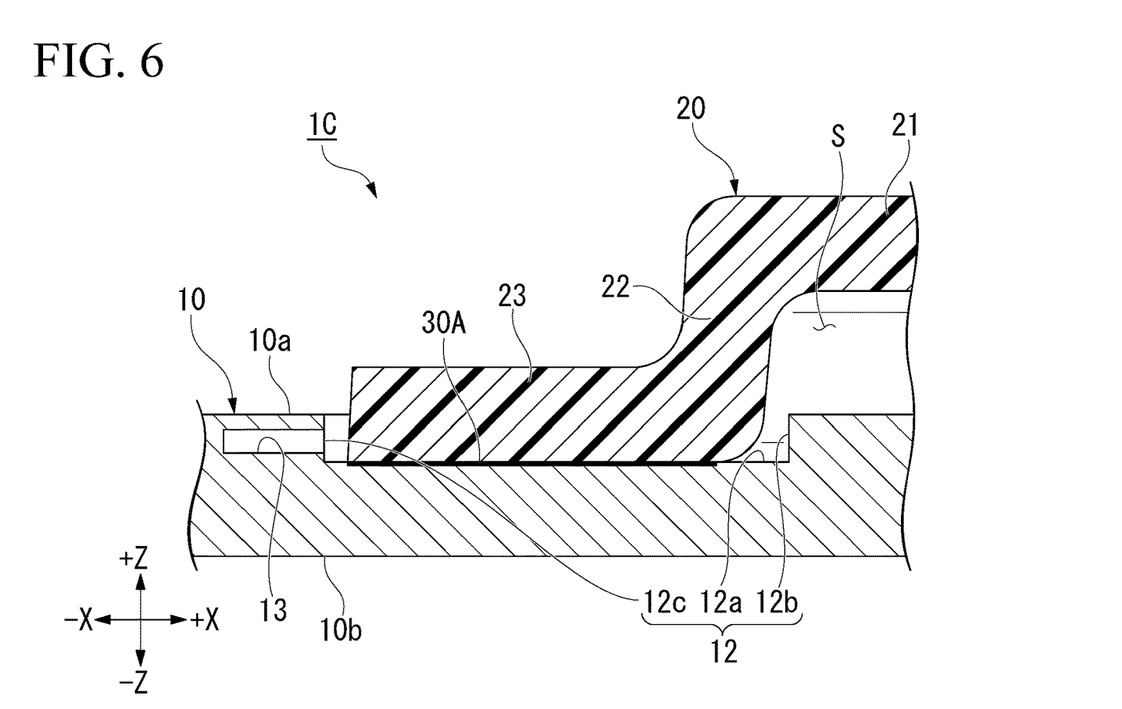
FIG. 6 is an enlarged view illustrating a part of a cold plate according to third embodiments.

In a cold plate 1C illustrated in FIG. 6, a resin reservoir 13 is disposed at a position overlapping a first surface 10a of the base plate 10 when viewed from the facing direction Z. In other words, when viewed from the facing direction Z, the resin reservoir 13 overlaps the first surface 10a. The resin reservoir 13 according to one or more embodiments is recessed outward in a first direction X or a second direction Y from an outer side surface 12c of a recessed portion 12.

According to this configuration, since the resin reservoir 13 is formed, it is possible to obtain the same operation and effects as the cold plate 1B according to the second embodiments. Also, since the resin reservoir 13 does not open to the first surface 10a of the base plate 10, the resin melted from the resin cover 20 does not easily eject upward from the first surface 10a. Thereby, it is possible to more effectively suppress occurrence of burrs.

Fourth Embodiments

Next, fourth embodiments of the present invention will be described, but a basic configuration is the same as that of the first embodiments. Therefore, components which are the same are denoted by the same reference signs, description thereof will be omitted, and only different points will be described.

Figure 7:
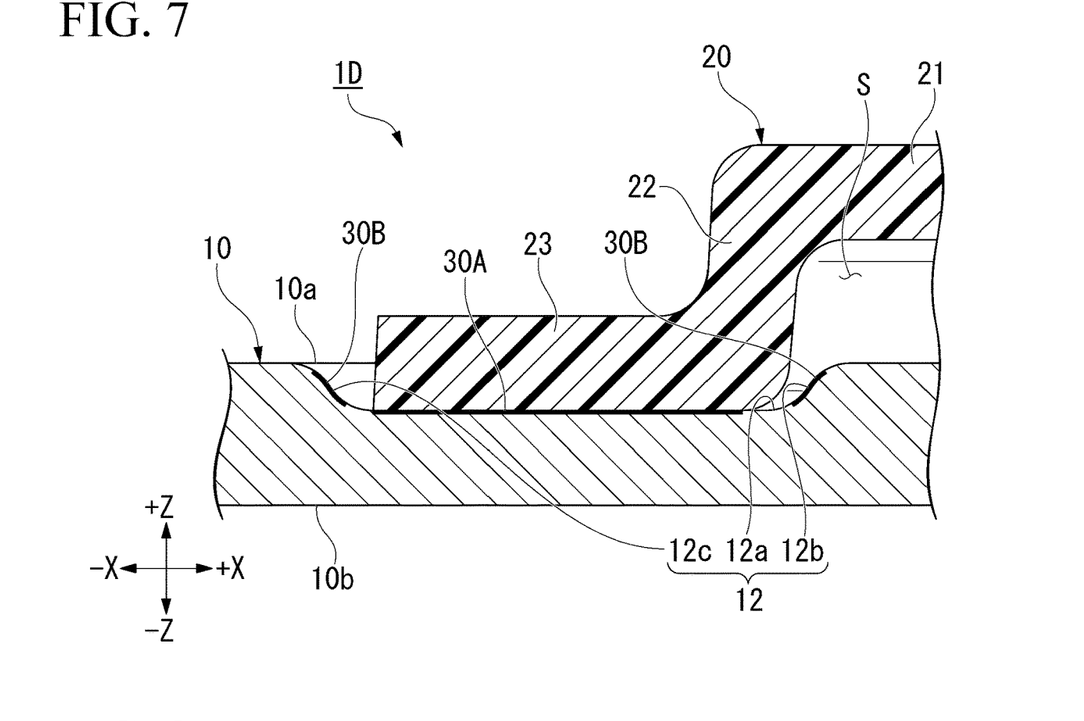
FIG. 7 is an enlarged view illustrating a part of a cold plate according to fourth embodiments.

As illustrated in FIG. 7, in a cold plate 1D according to one or more embodiments, a recessed portion 12 has a tapered structure in which an inner diameter of the recessed portion 12 gradually increases in an upward direction. In other words, the recessed portion 12 has a tapered structure in which the inner diameter of the recessed portion 12 gradually increases in a direction from a bottom surface 12a toward a first surface 10a. Particularly, an inner side surface 12b of the recessed portion 12 according to one or more embodiments is gradually inclined inward in a first direction X or a second direction Y in the upward direction. An outer side surface 12c of the recessed portion 12 according to one or more embodiments is gradually inclined outward in the first direction X or the second direction Y in the upward direction.

Second roughened portions 30B are formed on the inner side surface 12b and the outer side surface 12c according to one or more embodiments. It is possible to form the second roughened portions 30B by, for example, irradiating the inner side surface 12b and the outer side surface 12c with laser. In the example of FIG. 7, the inner side surface 12b and the outer side surface 12c are inclined such that an inner diameter of the recessed portion 12 gradually increases in the upward direction. Therefore, it is possible to directly apply laser light applied downward to the inner side surface 12b and the outer side surface 12c. Particularly, it is easier to irradiate the inner side surface 12b and the outer side surface 12c with laser light compared to a case in which the inner side surface 12b and the outer side surface 12c are provided parallel to the facing direction Z. When both a first roughened portion 30A and the second roughened portion 30B are formed by laser irradiation, formation of the first roughened portion 30A and formation of the second roughened portion 30B may be performed by the same laser irradiation machine.

The second roughened portions 30B formed on the inner side surface 12b and the outer side surface 12c have a plurality of micropores 30a similarly to the first roughened portion 30A. Further, when the second roughened portions 30B are formed by laser irradiation, the inner side surface 12b and the outer side surface 12c are oxidized by an action of laser light, and OH groups become abundant on a surface of the second roughened portion 30B. That is, molecules of the resin melted from a resin cover 20 are easily adsorbed to the second roughened portion 30B. In other words, wettability of the second roughened portion 30B is improved by an action of the laser light. Thereby, the resin melted out of the resin cover 20 becomes more difficult to eject out of the recessed portion 12. Therefore, formation of burrs is further suppressed.

Note that, shapes of the inner side surface 12b and the outer side surface 12c are not limited to the example of FIG. 6. It is possible to appropriately change shapes of the inner side surface 12b and the outer side surface 12c as long as the recessed portion 12 has a tapered structure in which the inner diameter gradually increases in the upward direction. For example, one of the inner side surface 12b and the outer side surface 12c may be inclined with respect to the facing direction Z, and the other of the inner side surface 12b and the outer side surface 12c may be formed parallel to the facing direction Z.

A configuration of the second roughened portion 30B is not limited to the example in FIG. 7. The second roughened portion 30B may be formed only on the inner side surface 12b or may be formed only on the outer side surface 12c. The second roughened portion 30B may be formed only on a portion of the inner side surface 12b or the outer side surface 12c, or may be formed over the entire inner side surface 12b and the outer side surface 12c.

As described above, in the cold plate 1D according to one or more embodiments, the recessed portion 12 has a tapered structure in which an inner diameter of the recessed portion 12 gradually increases in a direction from the bottom surface 12a of the recessed portion 12 toward the first surface 10a, and the second roughened portion 30B is formed on a side surface of the recessed portion 12. With this configuration, wettability of the inner side surface 12b and the outer side surface 12c is improved, and the molten resin becomes more difficult to eject out of the recessed portion 12. Also, when the second roughened portion 30B is formed by laser irradiation, since the recessed portion 12 has a tapered structure, it is possible to easily irradiate the inner side surface 12b or the outer side surface 12c with laser light. Therefore, it is possible to more reliably improve wettability of the inner side surface 12b and the outer side surface 12ced.

Fifth Embodiments

Next, fifth embodiments of the present invention will be described, but a basic configuration is the same as that of the first embodiments. Therefore, components which are the same are denoted by the same reference signs, description thereof will be omitted, and only different points will be described.

Figure 8:
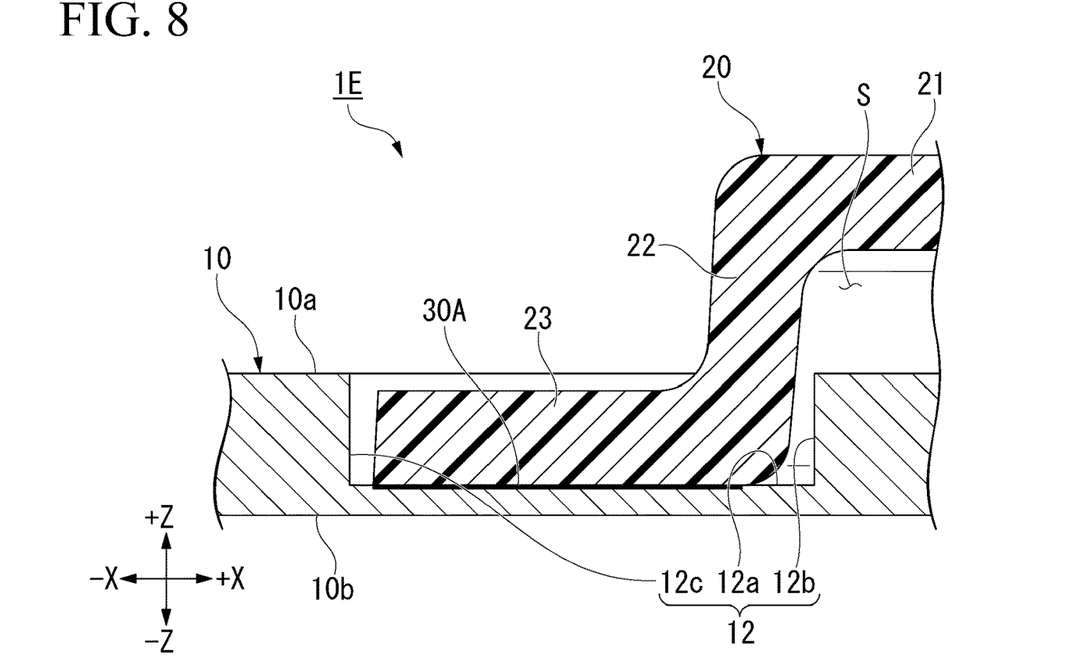
FIG. 8 is an enlarged view illustrating a part of a cold plate according to fifth embodiments.

In a cold plate 1E illustrated in FIG. 8, a dimension of a recessed portion 12 in the facing direction Z is larger than a dimension of a flange portion 23 in the facing direction Z.

By the dimension of the recessed portion 12 in the facing direction Z being increased in this way, it is possible to increase a volume of a molten resin that is capable of being accumulated in the recessed portion 12. That is, the molten resin overflowing from the recessed portion 12 is suppressed. Particularly in the cold plate 1E according to one or more embodiments, a volume of a space surrounded by the recessed portion 12 (a volume of the recessed portion 12) is larger than a volume of the flange portion 23. Therefore, even when it is assumed that the entire flange portion 23 is melted, the molten resin overflowing from the recessed portion 12 is suppressed.

Note that, the technical scope of the present invention is not limited to the above-described embodiments, and it is possible to make various modifications without departing from the spirit of the present invention.

For example, formation of the first roughened portion 30A and heat fusion of the resin cover 20 may not be performed on the bottom surface 12a, but may be performed on, for example, the inner side surface 12b, the outer side surface 12c, or the like.

The resin cover 20 may not include the flange portion 23. In this case, a lower surface of the circumferential wall portion 22 may be heat-fused to the base plate 10.

The resin cover 20 may be heat-fused to the base plate 10 without forming the first roughened portion 30A on an inner surface of the recessed portion 12. Also, in a case in which the first roughened portion 30A is formed, the first roughened portion 30A may be formed over the entire bottom surface 12a of the recessed portion 12, or may be formed on a portion of the bottom surface 12a.

Figure 9:
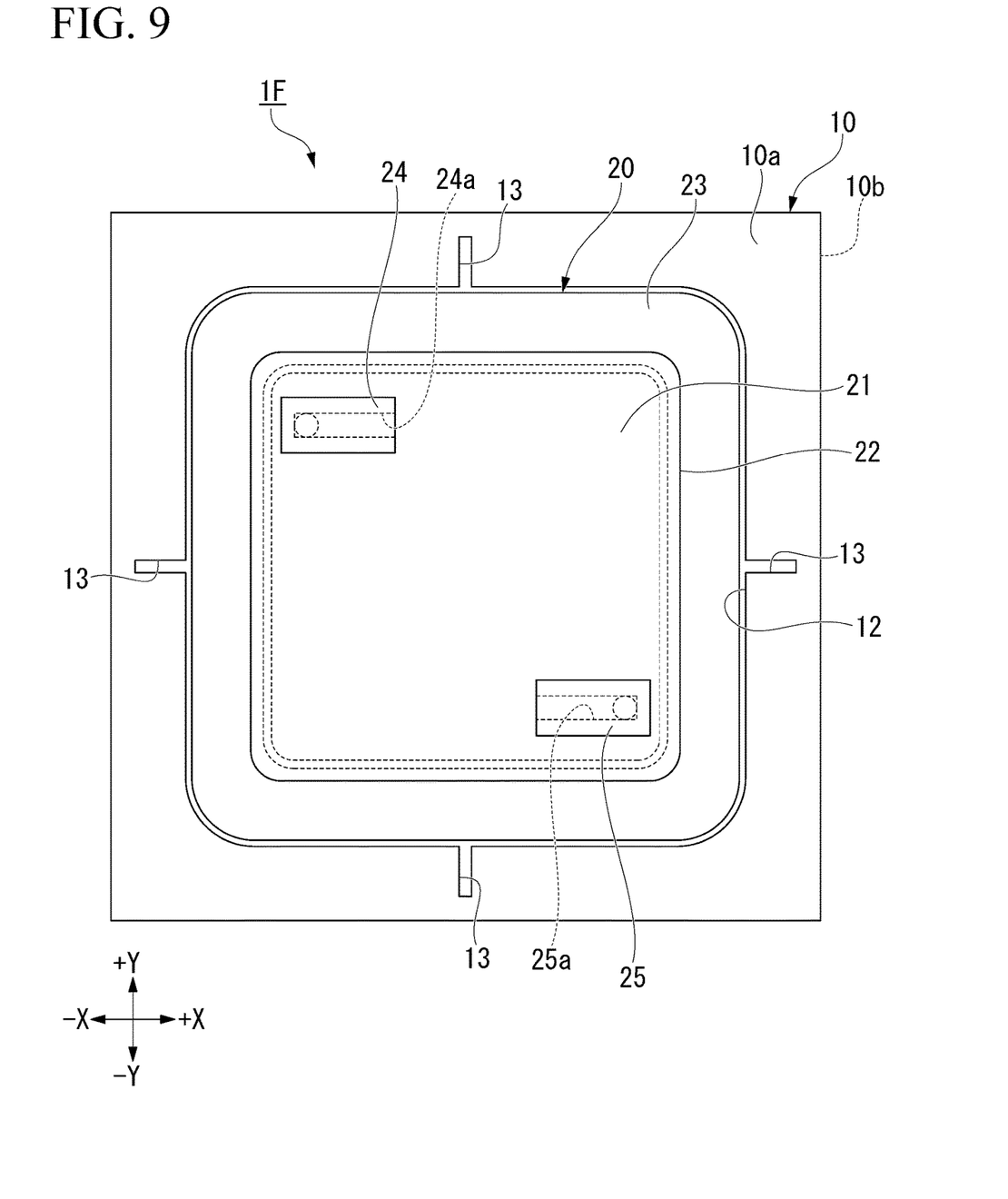
FIG. 9 is a plan view illustrating a cold plate according to a modified example.

A shape and a configuration of the resin reservoir 13 are not limited as long as the resin reservoir 13 communicates with a space surrounded by the recessed portion 12. For example, a plurality of resin reservoirs 13 (four resin reservoirs 13 in FIG. 9) may be formed as in a cold plate 1F illustrated in FIG. 9. In the example of FIG. 9, each resin reservoir 13 opens to the first surface 10a of the base plate 10. In this case, it is possible to form the resin reservoir 13 by, for example, subjecting the first surface 10a to etching processing, cutting processing, laser processing, or the like. Each resin reservoir 13 protrudes outward in the first direction X or the second direction Y from the recessed portion 12 when viewed from the facing direction Z. Thereby, the fins 11 are hard to become obstacles when the resin reservoirs 13 are formed. As described above, in the cold plate 1F illustrated in FIG. 9, the resin reservoirs 13 each protrude outward from the recessed portion 12 when viewed from the facing direction Z, and the resin reservoir 13 opens to the first surface 10a. It is possible to reduce a degree of difficulty in forming the resin reservoir 13 by this configuration.

In addition, it is possible to appropriately replace the components in the above-described embodiments with well-known components within a range not departing from the spirit of the present invention, and furthermore, the above-described embodiments and modified examples may be appropriately combined.

For example, by combining the forms illustrated in FIGS. 5 and 9, a cold plate including both the resin reservoir 13 recessed downward from the bottom surface 12a of the recessed portion 12 and the resin reservoir 13 protruding outward from the recessed portion 12 when viewed from the facing direction Z may be employed.

A structure illustrated in FIG. 8 in which a dimension of the recessed portion 12 in the facing direction Z is larger than a dimension of the flange portion 23 in the facing direction Z may also be applied to the first to fourth embodiments.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST 1A to 1F Cold plate
10 Base plate
10a Upper surface (first surface)
10b Heat source surface (second surface)
11 Fin
12 Recessed portion
12a Bottom surface (inner surface)
12b Inner side surface (inner surface, side surface)
12c Outer side surface (inner surface, side surface)
13 Resin reservoir
20 Resin cover
23 Flange portion
30A First roughened portion
30B Second roughened portion
30a Micropore

The invention claimed is:

1. A cold plate comprising:
a metal base plate having:
   a first surface,
   a second surface on a side opposite the first surface, and
   fins disposed in parallel on the first surface; and
a topped cylindrical resin cover covering the fins, wherein
the first surface has a recessed portion recessed toward the second surface, and
the topped cylindrical resin cover is heat-fused to the metal base plate on an inner surface of the recessed portion.

2. The cold plate according to claim 1, wherein
the recessed portion comprises a first roughened portion having micropores on the inner surface of the recessed portion, and
the topped cylindrical resin cover is heat-fused to the metal base plate at the first roughened portion.

3. The cold plate according to claim 1, wherein the metal base plate further has a resin reservoir communicating with a space surrounded by the recessed portion.

4. The cold plate according to claim 3, wherein the resin reservoir is recessed from a bottom surface of the recessed portion toward the second surface.

5. The cold plate according to claim 3, wherein
the resin reservoir protrudes outward from the recessed portion when viewed from a direction in which the metal base plate faces the topped cylindrical resin cover, and
the resin reservoir opens to the first surface.

6. The cold plate according to claim 3, wherein the resin reservoir overlaps the first surface when viewed from a direction in which the metal base plate faces the topped cylindrical resin cover.

7. The cold plate according to claim 1, wherein
an inner diameter of the recessed portion gradually increases in a direction from a bottom surface of the recessed portion toward the first surface, and
the recessed portion comprises a second roughened portion on a side surface of the recessed portion.

8. The cold plate according to claim 1, wherein
the topped cylindrical resin cover comprises a flange portion at an opening end portion of the topped cylindrical resin cover,
the flange portion extend s toward an outside of the topped cylindrical resin cover and has a surface that is heat-fused to the metal base plate, and
a dimension of the recessed portion in a direction in which the metal base plate faces the topped cylindrical resin cover is larger than a dimension of the flange portion in the direction.

* * * * *